(12) United States Patent
Wu et al.

(10) Patent No.: US 9,634,125 B2
(45) Date of Patent: Apr. 25, 2017

(54) FIN FIELD EFFECT TRANSISTOR DEVICE AND FABRICATION METHOD THEREOF

(71) Applicant: UNITED MICROELECTRONICS CORPORATION, Hsinchu (TW)

(72) Inventors: Yen-Liang Wu, Taipei (TW); Chung-Fu Chang, Tainan (TW); Yu-Hsiang Hung, Tainan (TW); Ssu-I Fu, Kaohsiung (TW); Wen-Jiun Shen, Douliou (TW); Man-Ling Lu, Gueishan Township (TW); Chia-Jong Liu, Gaoshu Township (TW); Yi-Wei Chen, Taichung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/046,467

(22) Filed: Feb. 18, 2016

(65) Prior Publication Data
US 2016/0163837 A1    Jun. 9, 2016

Related U.S. Application Data

(62) Division of application No. 14/490,624, filed on Sep. 18, 2014, now abandoned.

(51) Int. Cl.
*H01L 29/66* (2006.01)
*H01L 29/06* (2006.01)
*H01L 29/78* (2006.01)
*H01L 29/10* (2006.01)

(52) U.S. Cl.
CPC .... *H01L 29/66795* (2013.01); *H01L 29/0649* (2013.01); *H01L 29/1054* (2013.01); *H01L 29/6656* (2013.01); *H01L 29/785* (2013.01)

(58) Field of Classification Search
CPC ............. H01L 29/66795; H01L 29/785; H01L 29/6656; H01L 29/0649
See application file for complete search history.

(56) References Cited

U.S. PATENT DOCUMENTS

| | | | |
|---|---|---|---|
| 2005/0224800 A1 | 10/2005 | Lindert | |
| 2010/0261328 A1* | 10/2010 | Kujirai | H01L 21/84 438/296 |
| 2011/0201189 A1 | 8/2011 | Byun | |
| 2013/0244396 A1* | 9/2013 | Oh | H01L 29/66795 438/400 |
| 2014/0127872 A1* | 5/2014 | Oh | H01L 29/66795 438/285 |
| 2015/0303118 A1* | 10/2015 | Wang | H01L 21/823481 257/401 |

\* cited by examiner

*Primary Examiner* — John P Dulka
*Assistant Examiner* — Christina Sylvia
(74) *Attorney, Agent, or Firm* — Ding Yu Tan

(57) ABSTRACT

A field effect transistor (FinFET) device includes a substrate, a fin structure, a shallow trench isolation and a gate structure. The fin structure is formed on a surface of the substrate and includes a base fin structure and an epitaxial fin structure formed on the base fin structure. The shallow trench isolation structure is formed on the surface of the substrate and includes a peripheral zone and a concave zone. The peripheral zone physically contacts with the fin structure. The gate structure is disposed on the epitaxial fin structure perpendicularly. A method of fabricating the aforementioned field effect transistor is also provided.

12 Claims, 18 Drawing Sheets

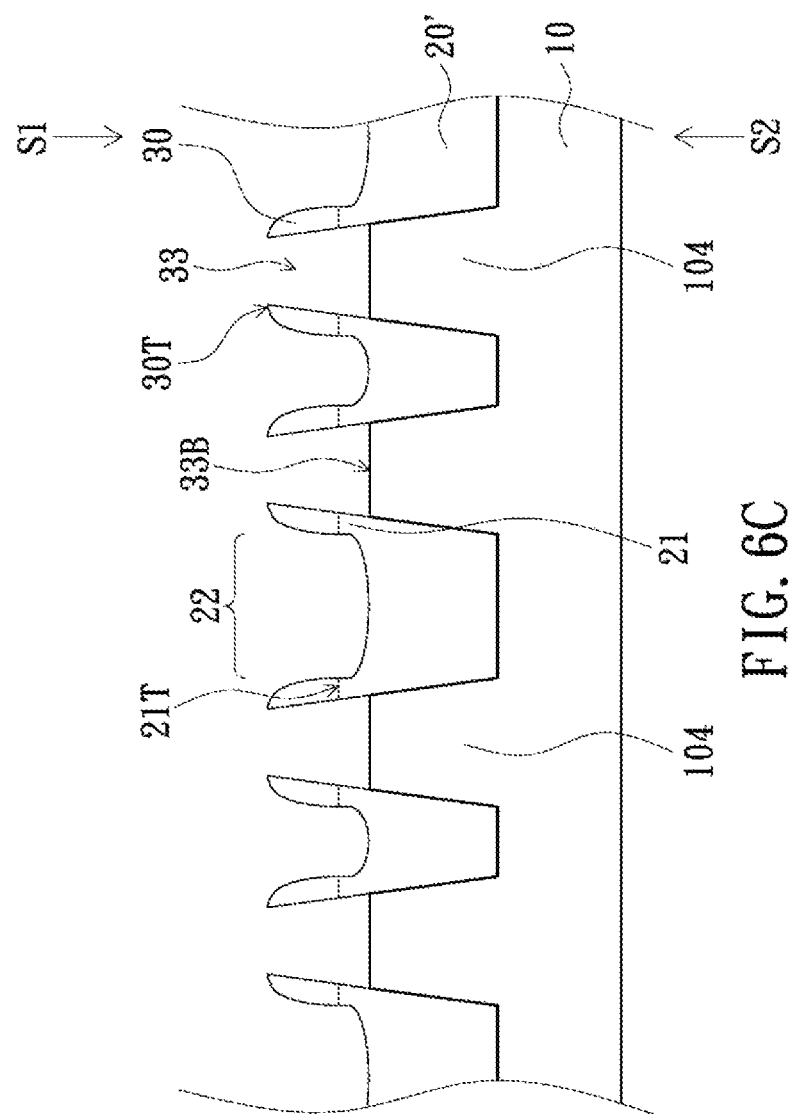

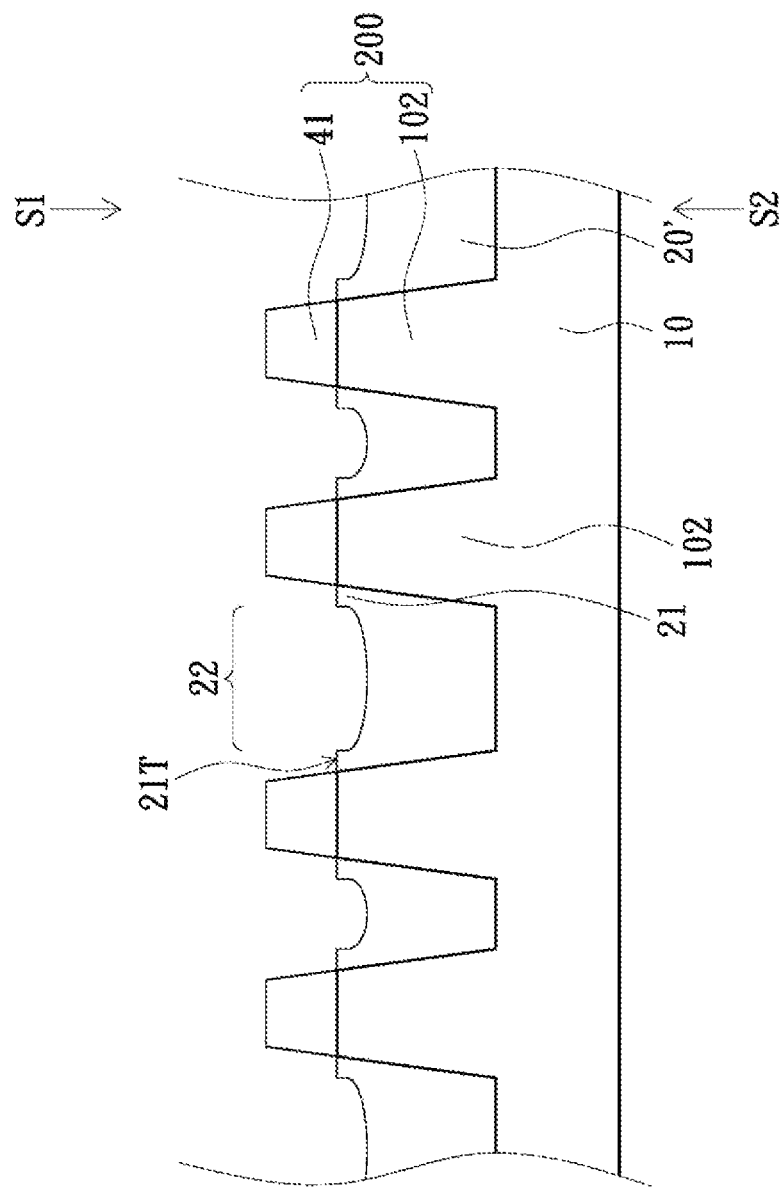

FIN FIELD EFFECT TRANSISTOR DEVICE AND FABRICATION METHOD THEREOF

CROSS-REFERENCE TO RELATED APPLICATION

The present application is a divisional application claiming priority benefit from a U.S. Patent Application bearing Ser. No. 14/490,624 filed on Sep. 18, 2014. Now the contents of U.S. Patent Application bearing Ser. No. 14/490,624 is hereby incorporated by reference herein in its entirety and made a part of this specification.

FIELD OF THE INVENTION

The present invention relates to a field effect transistor device and a fabrication method thereof, and more particularly to a fin field effect transistor device and its fabrication method.

BACKGROUND OF THE INVENTION

With the progress of technology, electronic devices are pursued to be miniaturized and keep performances improved in the interim. Therefore, technique of fin field effect transistor (FinFET) is introduced to improve performances of traditional field effect transistor (traditional FET). A fin field effect transistor has a fin-shaped structure to form a non-planar double-gate transistor built on a silicon-on-insulator (SOI) substrate, unlike a traditional field effect transistor with a planar structure. The fin-shaped double-gate structure makes it possible to have two electrically independent control gates in order to enhance the flexibility of electrical designs and produce devices with higher efficiency and lower electric consumption. The tendency of pursuing miniaturization and high performances makes FinFET technology to be a main trend of future electronic industry, however, the known fabricating methods and the device performances thereof still needs to be improved.

SUMMARY OF THE INVENTION

An aspect of the present invention is to provide a method of fabricating a fin field effect transistor (FinFET) device. The method includes steps of: providing a substrate having a fin structure on a surface of the substrate; forming an oxide layer on the substrate; removing a portion of the oxide layer to expose a portion of the fin structure and simultaneously form at least a shallow trench isolation structure; forming a pair of spacers on two sides of the exposed portion of the fin structure, respectively; removing another portion of the fin structure to form a cavity between the pair of spacers and simultaneously removing a portion of the shallow trench isolation structure not covered by the spacers; forming an epitaxial fin structure in the cavity; removing the pair of spacers; and forming a gate structure on the epitaxial fin structure, wherein an extending direction of the gate structure is perpendicular to an extending direction of the epitaxial fin structure.

In one embodiment of the present invention, a concave zone as well as a peripheral zone covered under the pair of spacers are simultaneously formed in the process of removing a portion of the shallow trench isolation structure, wherein a top surface of the peripheral zone is higher than a top surface of the concave zone.

In one embodiment of the present invention, a bottom surface of the cavity is coplanar with the top surface of the peripheral zone.

In one embodiment of the present invention, a bottom surface of the cavity is higher than the top surface of the peripheral zone.

In one embodiment of the present invention, a bottom surface of the cavity is lower than the top surface of the peripheral zone.

In one embodiment of the present invention, a top surface of the epitaxial fin structure is aligned to a top of the pair of spacers.

In one embodiment of the present invention, a top surface of the epitaxial fin structure is higher than a top of the pair of spacers.

In one embodiment of the present invention, a top surface of the epitaxial fin structure is lower than a top of the pair of spacers.

In one embodiment of the present invention, the epitaxial fin structure physically contacts with a bottom surface of the cavity, the epitaxial fin structure comprises germanium (Ge), and a percentage of the germanium (Ge) in the epitaxial fin structure is from 50% to 100%.

In one embodiment of the present invention, the method of fabricating a FinFET device further includes the following steps. A portion of the epitaxial fin structure not covered by the gate structure is partially removed to form a removed area; and a source/drain structure grows epitaxially in the removed area, wherein a composition of the source/drain structure is different from that of the epitaxial fin structure.

Another aspect of the present invention is to provide fin field effect transistor (FinFET) device, which includes a substrate, a fin structure, a shallow trench isolation and a gate structure. The fin structure is formed on a surface of the substrate and includes a base fin structure and an epitaxial fin structure formed on the base fin structure. The shallow trench isolation structure is formed on the surface of the substrate and includes a peripheral zone and a concave zone. The peripheral zone physically contacts with the fin structure. The gate structure is disposed on the epitaxial fin structure perpendicularly.

In one embodiment of the present invention, a bottom surface of the epitaxial fin structure is coplanar with a top surface of the peripheral zone.

In one embodiment of the present invention, a bottom surface of the epitaxial fin structure is higher than a top surface of the peripheral zone.

In one embodiment of the present invention, a bottom surface of the epitaxial fin structure is lower than a top surface of the peripheral zone.

In one embodiment of the present invention, the FinFET device further includes a source/drain structure and a fin-shaped channel structure. The source/drain structure is not covered by the gate structure. The fin-shaped channel structure is covered under the gate structure. The fin-shaped channel structure includes germanium (Ge). A percentage of the germanium (Ge) in the epitaxial fin structure is from 50% to 100%. A composition of the fin-shaped channel structure is different from that of the source/drain structure.

In one embodiment of the present invention, the epitaxial fin structure includes germanium (Ge), and a composition of the epitaxial fin structure is different from that of the substrate.

BRIEF DESCRIPTION OF THE DRAWINGS

The present invention will become more readily apparent to those ordinarily skilled in the art after reviewing the following detailed description and accompanying drawings, in which:

FIGS. 1-6A are cross sectional views illustrating parts of a method of fabricating a FinFET device in accordance with an embodiment of the present invention;

FIG. 6C is a cross sectional view illustrating parts of a method of fabricating a FinFET device in accordance with still another embodiment of the present invention;

FIGS. 8-9 are cross sectional views illustrating parts of a method of fabricating a FinFET device in accordance with an embodiment of the present invention;

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a fin field effect transistor device and a fabrication method thereof that not only has improved device performance and quality but also has lower fabrication cost and time. The present invention is illustrated in detail below with examples of various embodiments and figures for better understanding of purposes, features and advantages of the present application.

Figure 1:
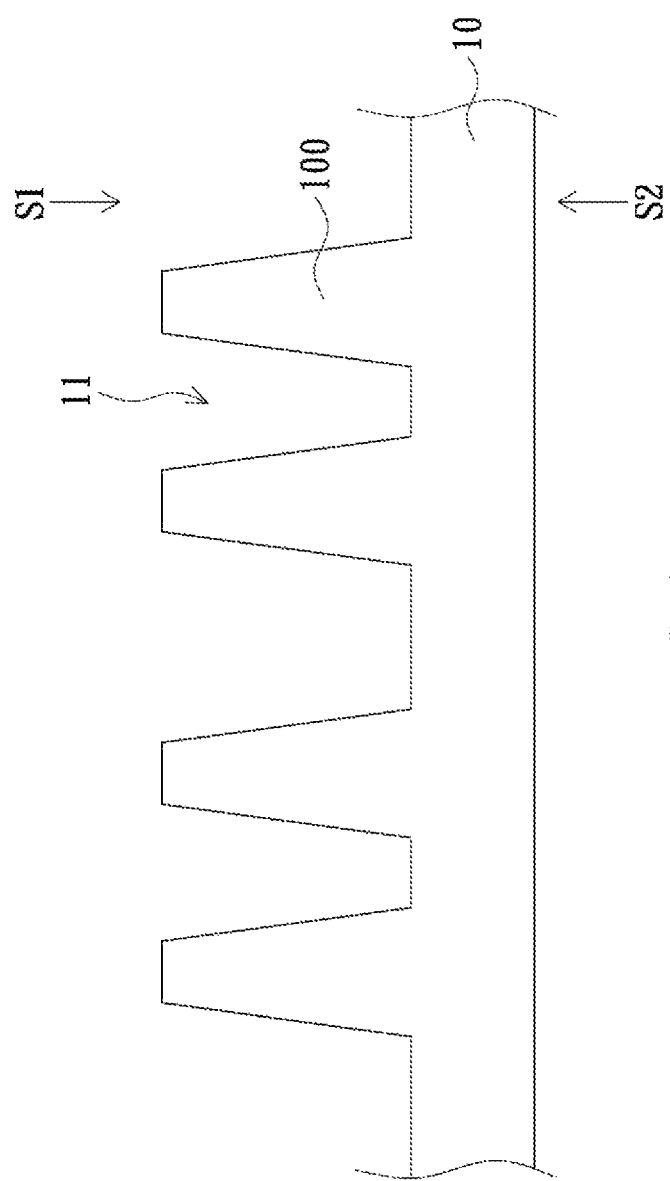
Figure 2:
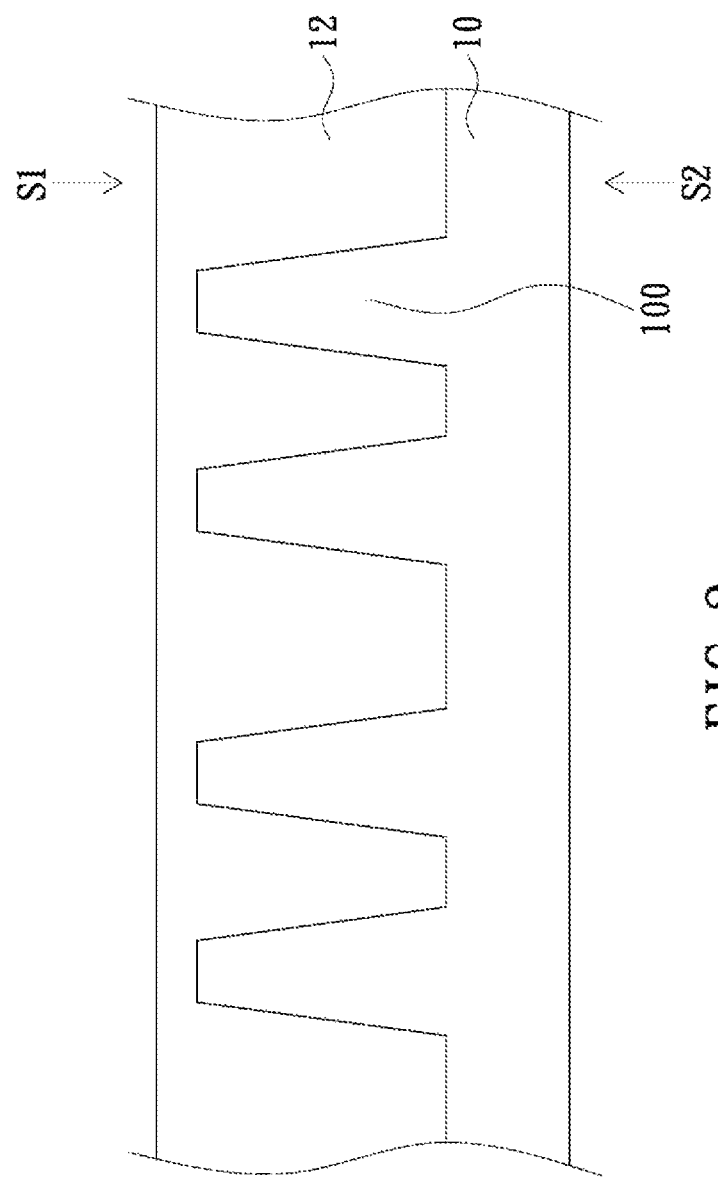
Figure 3:
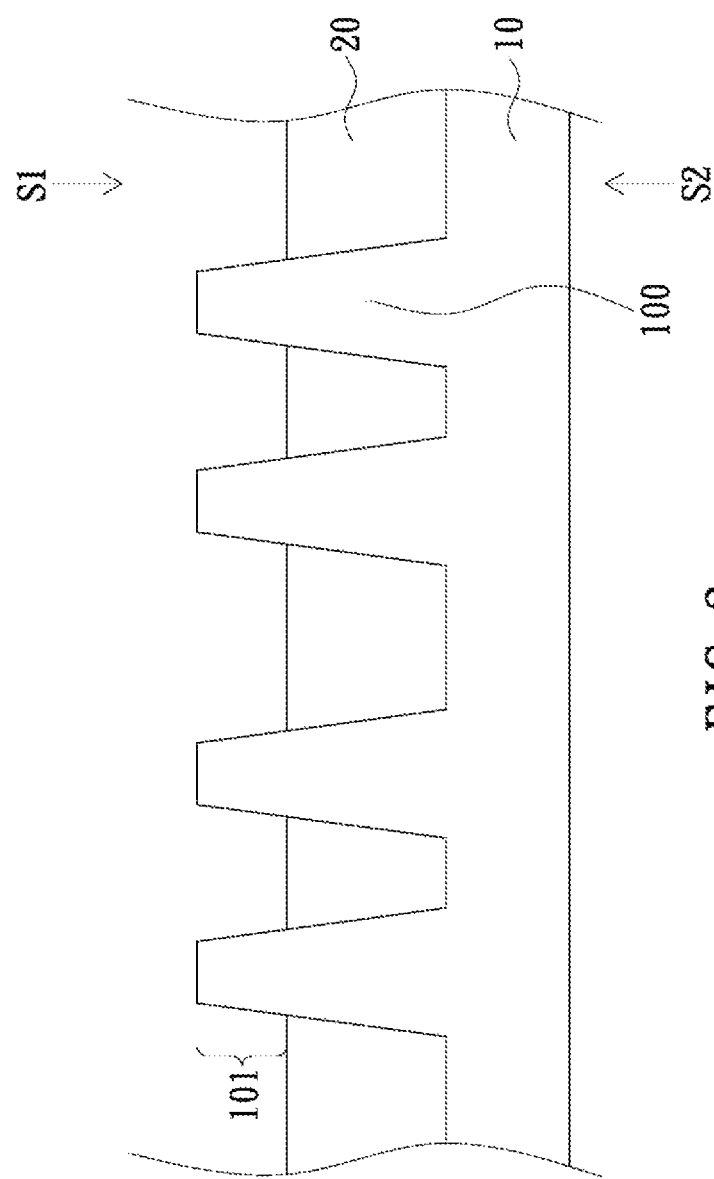

FIGS. 1~13 are cross sectional views illustrating a method of fabricating a fin field effect transistor (FinFET) device in accordance with an embodiment of the present invention. As shown in FIG. 1, firstly a substrate 10 having a first side S1 and a second side S2 is provided. The substrate 10 is, for example, silicon or other semiconductor material. A portion of the substrate 10 on the first side S1 is removed to form at least one shallow trench 11 and at least one fin structure 100. Herein a plurality of shallow trenches 11 and a plurality of fin structures 100 are exemplified in FIG. 1 and the shallow trenches 11 and the fin structures 100 are adjacent and disposed alternatively with each other. The formation of the shallow trench 11 and the fin structure 100 may be realized by a general lithography process and a general etching process, such as dry etching or other existing etching methods. Then, as shown in FIG. 2, an oxide layer 12 is formed on the fin structures 100 and the substrate 10 to fill up the shallow trenches 11 and cover the whole upper surfaces of the fin structures 100 and the substrate 10. The formation of the oxide layer 12 may be realized by chemical vapor deposition (CVD), physical vapor deposition (PVD), atomic layer deposition (ALD) and so on. Then, as shown in FIG. 3, a portion of the oxide layer 12 is removed to expose an exposed portion 101 of the respective fin structures 100 and simultaneously form at least one shallow trench isolation (STI) structure 20. The removal of the portion of the oxide layer 12 may be realized by the general etching methods (such as dry or wet etching) and the wet etching solution such as HF solution, KOH solution, $NH_4F$ solution, and etc. if the wet etching is adopted. The etching process can be adjusted based on the required height of the exposed portion 101 of the fin structure 100. In one embodiment, the height of the exposed portion 101 of the fin structure 100 is within a range from 200 nm to 500 nm.

Figure 4:
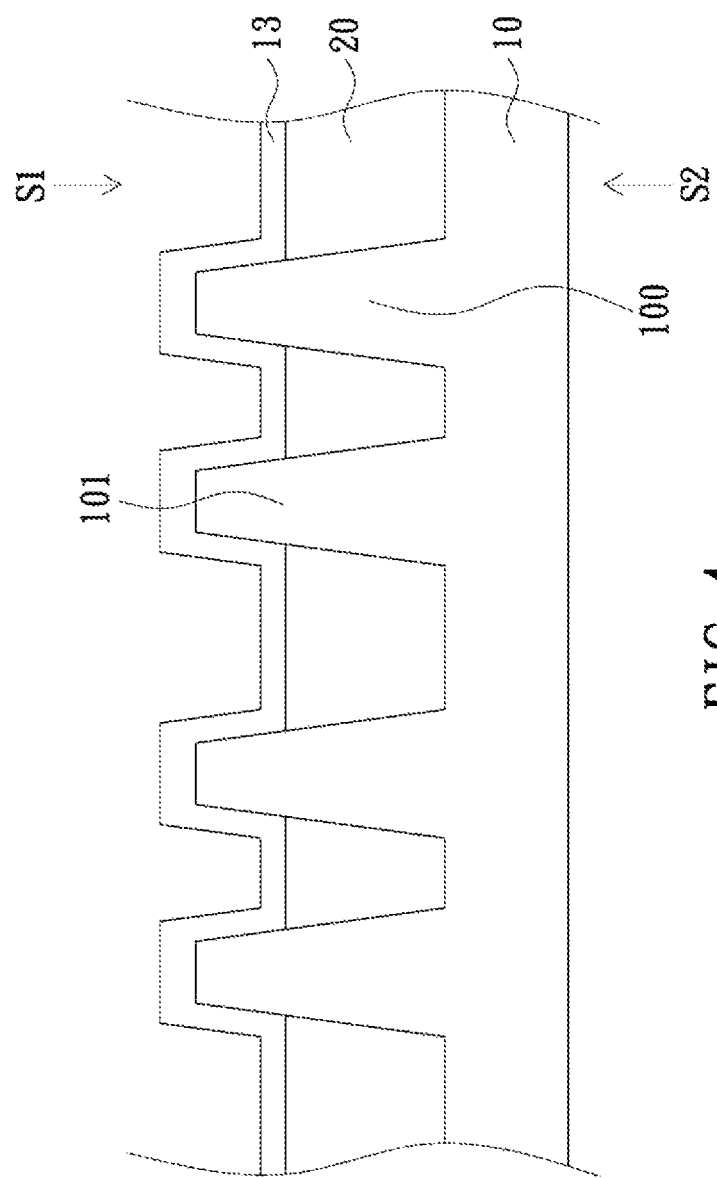
Figure 5:
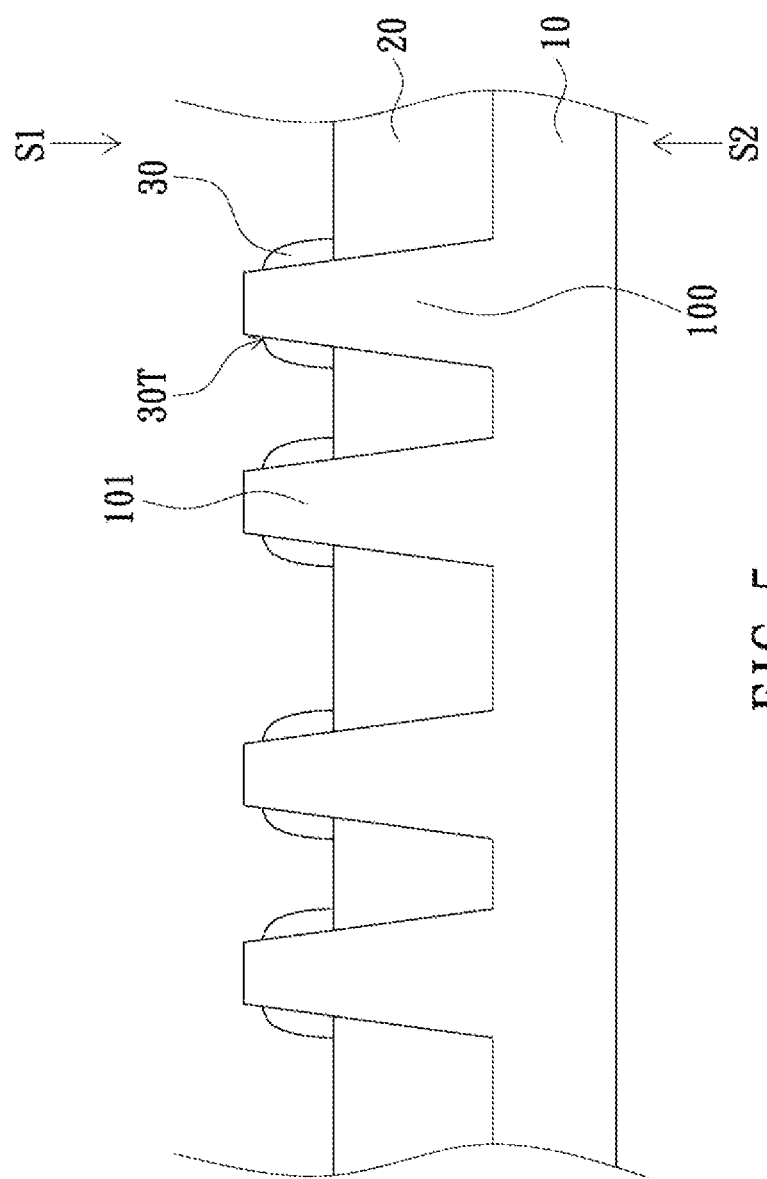

Then, a pair of spacers is formed on two opposite sides of each exposed portion 101 of the fin structure 100 to define a shape of an epitaxial fin structure in the following fabricating process. The process of forming the spacers is illustrated in FIGS. 4 and 5. First, as shown in FIG. 4, a material layer 13 is formed on the exposed portions 101 of the fin structure 100 and the STI structures 20; wherein the material layer 13 is conformal with the exposed portions 101 and the STI structures 20. In one embodiment, the material layer 13 may have a thickness within a range from 100 Å to 200 Å. Then, as shown in FIG. 5, an etching back process is performed to remove a portion of the material layer 13 thereby forming a plurality of spacers 30 on a portion of a surface of the STI structure 20. Each exposed portion 101 is formed with a pair of spacers 30 on the two opposite sides thereof. Specifically, each spacer 30 has two side walls, one is a linear inner side wall which is physically contacted with the respective exposed portion 101, and the other one is a curved outer side wall which is formed away from the respective exposed portion 101. In addition, each spacer 30 is formed to cover and contact with a portion of the respective STI structure 20. Thus, each spacer 30 has a sail-shaped structure. The spacer 30 has a top 30T, which may be lower than or coplanar with a top surface of the respective exposed portion 101. As shown in FIG. 5, the top 30T of the spacer 30 is lower than the top surface of the exposed portion 101 in one embodiment of the present invention.

Figure 6A:
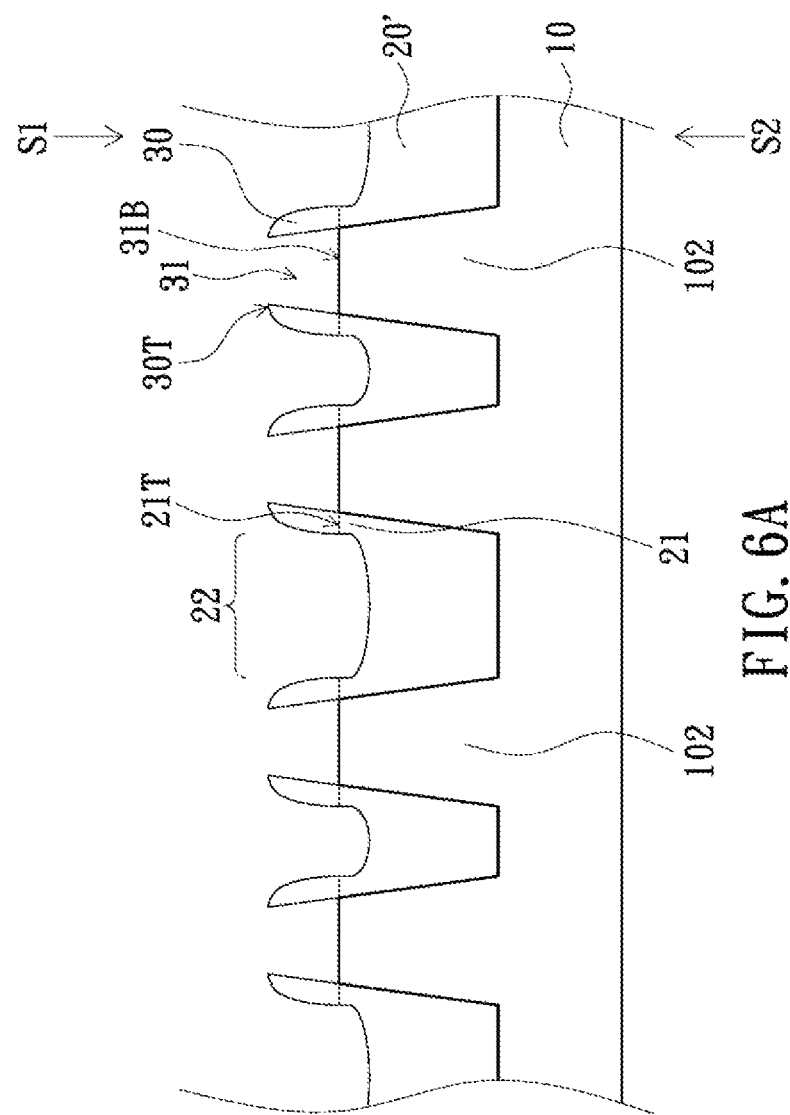
Figure 6B:
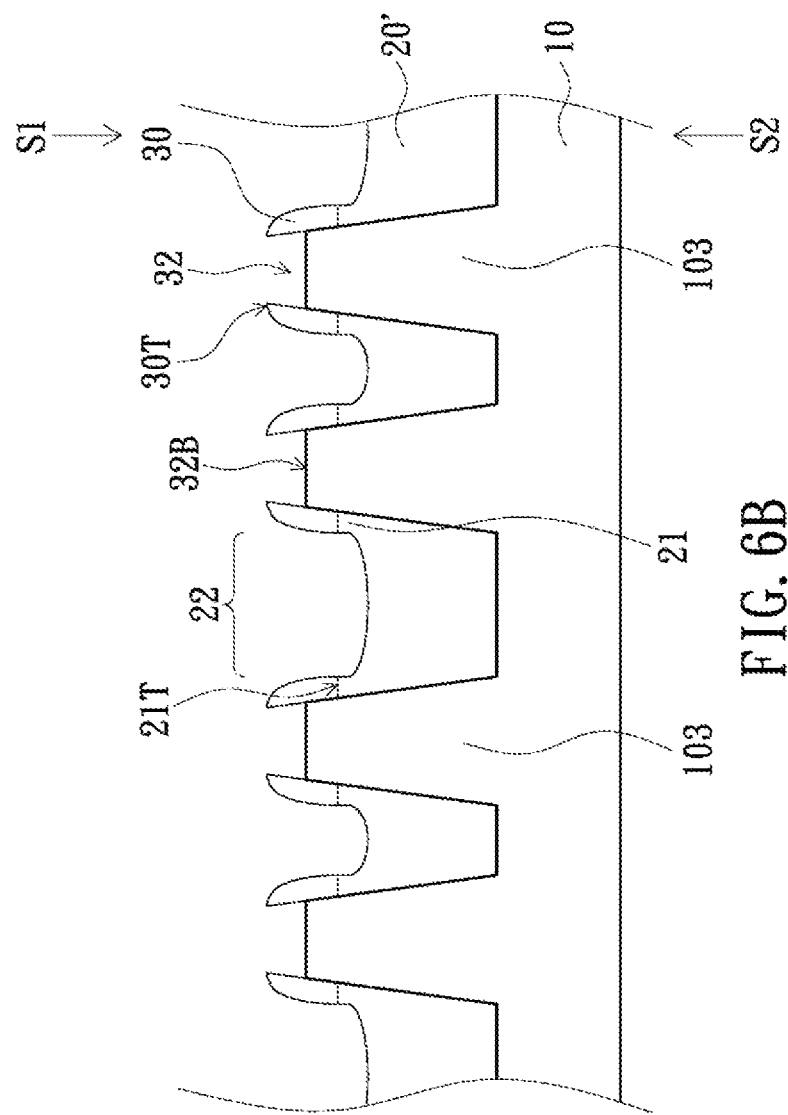
FIG. 6B is a cross sectional view illustrating parts of a method of fabricating a FinFET device in accordance with another embodiment of the present invention.

Then, a portion of the fin structure 100 is removed as shown in FIGS. 6A~6C; wherein each one of the FIGS. 6A~6C illustrates a respective embodiment. The removal of the portion of the fin structure 100 may be realized by dry or wet etching and using the solution such as HF solution, KOH solution, $NH_4F$ solution, and etc. if the wet etching is adopted. It should be noted that the fin structure 100 and the spacers 30 have a higher etching selectivity ratio existing therebetween so that most of the spacers 30 can be left behind without being removed with the portions of the fin structure 100. In addition, the fin structure 100 and the STI structures 20 may also have a high etching selectivity ratio existing therebetween. To facilitate a better etching effect, the etching solution with a higher selectivity may be chosen. During the etching process for removing a portion of the fin structure 100, it is inevitable that a small portion of the STI structures 20 may be simultaneously removed with the portion of the fin structure 100; thus, a plurality of concave zones 22 are formed. It is to be noted that a portion of the top surface of the STI structure 20 is covered and protected by one respective spacer 30; thus, a peripheral zone 21 is formed. Herein a STI structure 20' is defined as being formed by the etching process and having at least one peripheral zone 21 and a concave zone 22 on its surface.

Specifically, the peripheral zone 21 of the STI structure 20' is contacted with one side wall of the respective fin structure 100 and also is contacted with the respective spacer 30. The two opposite sides of the concave zone 22 of the STI structure 20' are contacted with the respective peripheral zones 21, respectively. Specifically, the concave zone 22 is formed on the side of the respective peripheral zone 21 not physically contacted with the respective fin structure 100. The top surface of the concave zone 22 is not covered by the respective spacer 30, and the top surface of the peripheral zone 21 is higher than the top surface of the concave zone 22.

In one embodiment as shown in FIG. 6A, the entire exposed portion 101 is removed by an etching process thereby forming a cavity 31 and a base fin structure 102. The cavity 31 is defined by two linear inner side walls of the respective spacers 30 and a top surface of the base fin structure 102. In other words, the top surface of the base fin structure 102 is a bottom surface 31B of the cavity 31. In the embodiment of FIG. 6A, the entire exposed portion 101 of the fin structure 100 is removed by the etching process so that the bottom surface 31B of the cavity 31 (and the top surface of the base fin structure 102) is coplanar with a top surface 21T of the peripheral zone 21.

In another embodiment as shown in FIG. 6B, only a portion of the exposed portion 101 of the fin structure 100 is removed by the etching process thereby forming a cavity 32 and a base fin structure 103. The cavity 32 is defined by two linear inner side walls of the respective spacers 30 and a top surface of the base fin structure 103. In other words, the top surface of the base fin structure 103 is a bottom surface 32B of the cavity 32. In the embodiment of FIG. 6B, only a portion of the exposed portion 101 of the fin structure 100 is removed by the etching process so that the bottom surface 32B of the cavity 32 (and the top surface of the base fin structure 103) is higher than a top surface 21T of the peripheral zone 21.

In still another embodiment as shown in FIG. 6C, a portion of the fin structure 100 (including the entire exposed portion 101) is removed by the etching process thereby forming a cavity 33 and a base fin structure 104. The cavity 33 is defined by two linear inner side walls of the respective spacers 30 and a top surface of the base fin structure 104. In other words, the top surface of the base fin structure 104 is a bottom surface 33B of the cavity 33. In the embodiment of FIG. 6C, a portion, which includes the entire exposed portion 101, of the fin structure 100 is removed by the etching process so that the bottom surface 33B of the cavity 33 (and the top surface of the base fin structure 104) is lower than a top surface 21T of the peripheral zone 21.

Figure 7A:
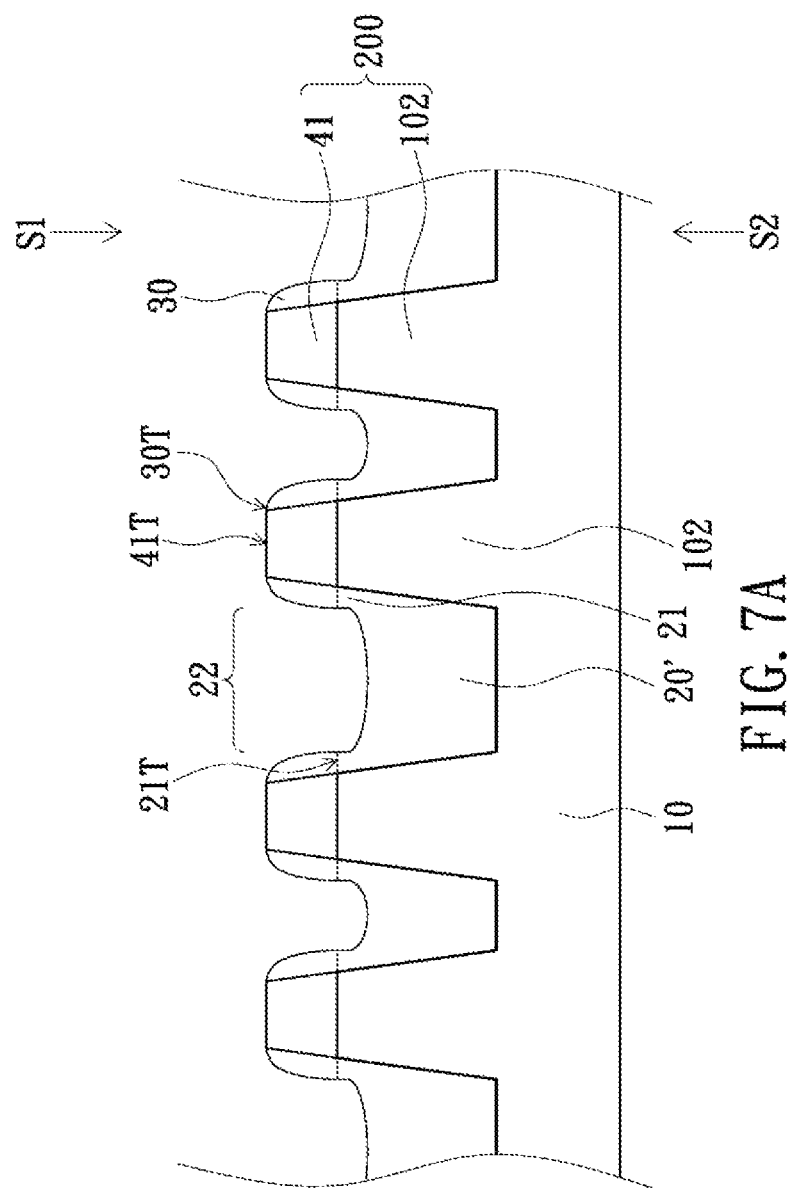
FIG. 7A is a cross sectional view illustrating parts of a method of fabricating a FinFET device in accordance with an embodiment of the present invention.
Figure 7B:
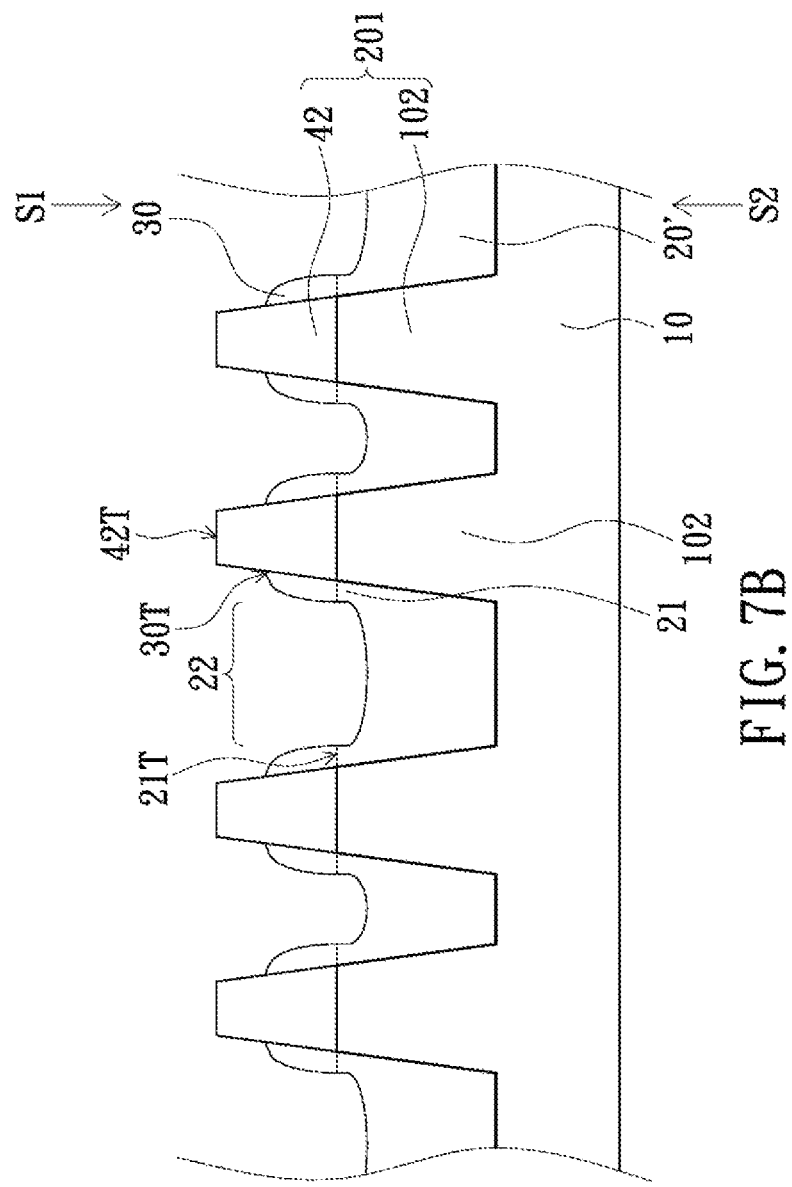
FIG. 7B is a cross sectional view illustrating parts of a method of fabricating a FinFET device in accordance with another embodiment of the present invention.
Figure 7C:
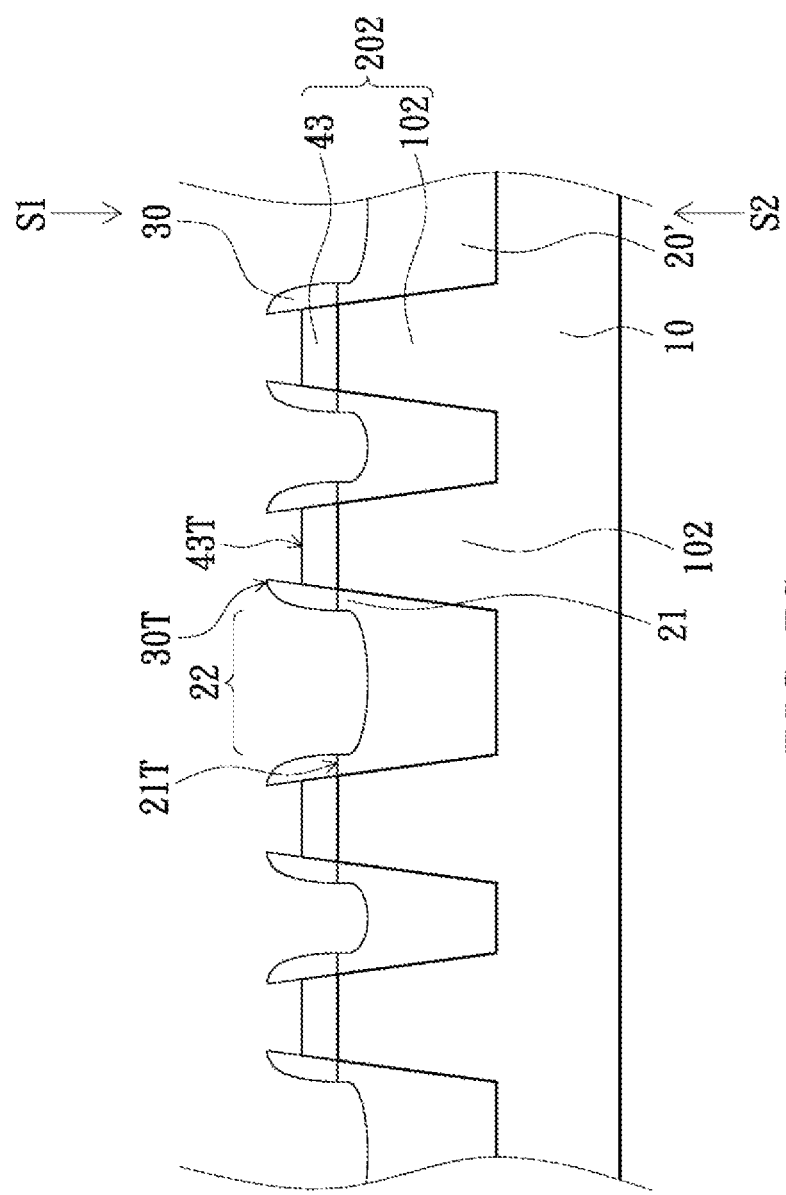
FIG. 7C is a cross sectional view illustrating parts of a method of fabricating a FinFET device in accordance with still another embodiment of the present invention.

Then, an epitaxial growing process for defining an epitaxial fin structure by the spacers is performed as shown in FIGS. 7A~7C; wherein each one of the FIGS. 7A~7C illustrates a respective embodiment. To facilitate an easier illustration and a better understanding of the present invention, the structure of FIG. 6 is taken as an example for the following illustration of the epitaxial growing process, but the present invention is not limited thereto. In one embodiment as shown in FIG. 7A, an epitaxial fin structure 41 is formed by performing the epitaxial growing process in the cavity 31; wherein the epitaxial fin structure 41 and the base fin structure 102 together constitute a fin structure 200. It should be noted that the epitaxial fin structure 41 has a top surface 41T aligned with the top 30T of the spacer 30. In another embodiment as shown in FIG. 7B, an epitaxial fin structure 42 is formed by performing epitaxial growing process in the cavity 31; wherein the epitaxial fin structure 42 and the base fin structure 102 together constitute a fin structure 201. It should be noted that the fin structure 42 has a top surface 42T higher than the top 30T of the spacer 30. In still another embodiment as shown in FIG. 7C, an epitaxial fin structure 43 is formed by performing the epitaxial growing process in the cavity 31; wherein the epitaxial fin structure 43 and the base fin structure 102 together constitute a fin structure 202. It should be noted that the epitaxial fin structure 43 has a top surface 43T lower than the top 30T of the spacer 30. Because all of the embodiments of FIGS. 7A~7C are illustrated based on the structure of FIG. 6A, the bottom surfaces of the epitaxial fin structures 41, 42, and 43 in FIGS. 7A, 7B and 7C are all coplanar with the top surface 21T of the peripheral zone 21, respectively.

The epitaxial fin structures 41, 42, and 43 in the aforementioned embodiments may include material such as germanium (Ge) or silicon-germanium, and the percentage of the germanium (Ge) in any one of the epitaxial fin structures 41, 42 and 43 is within a range from 50% to 100%. It is understood that FIGS. 7A~7C are used for an exemplary or illustrative purpose only; in other words, each one of the epitaxial growing processes illustrated in FIGS. 7A~7C can apply to any one of the structures of FIGS. 6B and 6C in response to an actual requirement. For example, when the structure having a bottom surface of the formed epitaxial fin structure higher than the top surface 21T of the peripheral zone 21 as illustrated in FIG. 6B is taken for the following epitaxial growing process, a respective epitaxial fin structure with a specific height is formed by employing one of the epitaxial growing processes provided by FIGS. 7A~7C in response to an actual requirement. For another example, when the structure having a bottom surface of the formed epitaxial fin structure lower than the top surface 21T of the peripheral zone 21 as illustrated in FIG. 6C is taken for the following epitaxial growing process, a respective epitaxial fin structure with a specific height is formed by employing one of the epitaxial growing processes provided by FIGS. 7A~7C in response to an actual requirement. It is understood that any modification of the steps disclosed in the aforementioned embodiments is still within the spirit and scope of the present invention.

Then, as shown in FIG. 8, the spacers 30 are removed by a general etching process thereby exposing the epitaxial structure. To facilitate an easier illustration and a better understanding of the present invention, the structure of FIG. 7A is took as an example for the following illustration of a manufacturing process, but the present invention is not limited thereto. As shown in FIG. 8, the epitaxial fin structure 41 is exposed after the respective spacers 30 are removed. In addition, the spacers 30 and the respective STI structures 20' may have a higher etching selectivity ratio existing therebetween. For example, the STI structure 20' can be made of oxides and the spacers 30 can be made of nitrides (e.g. silicon nitride). However, it is understood that the etching process for the removal of the spacers 30 may make the concave zone 22 of the STI structure 20' more concave.

Figure 9:
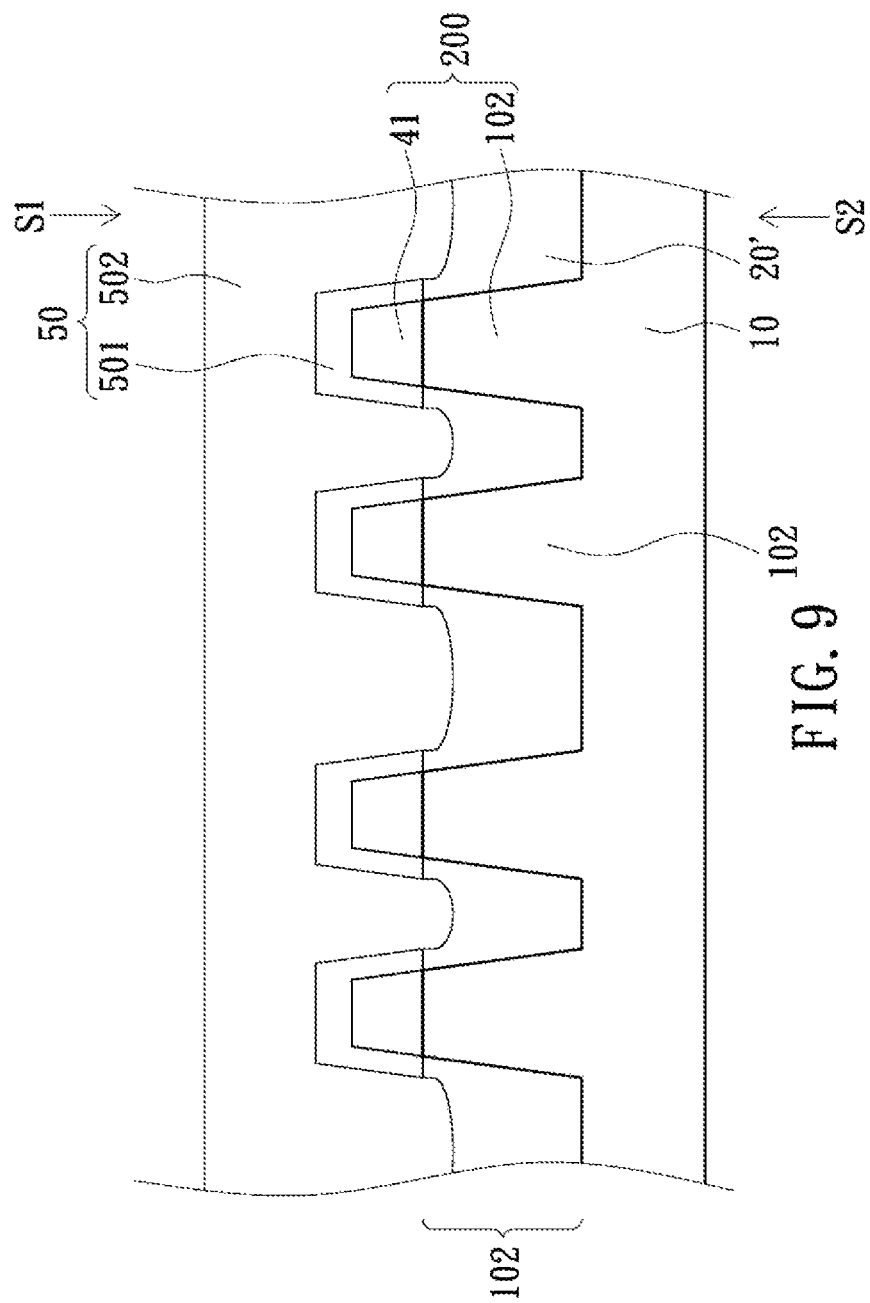
Figure 10:
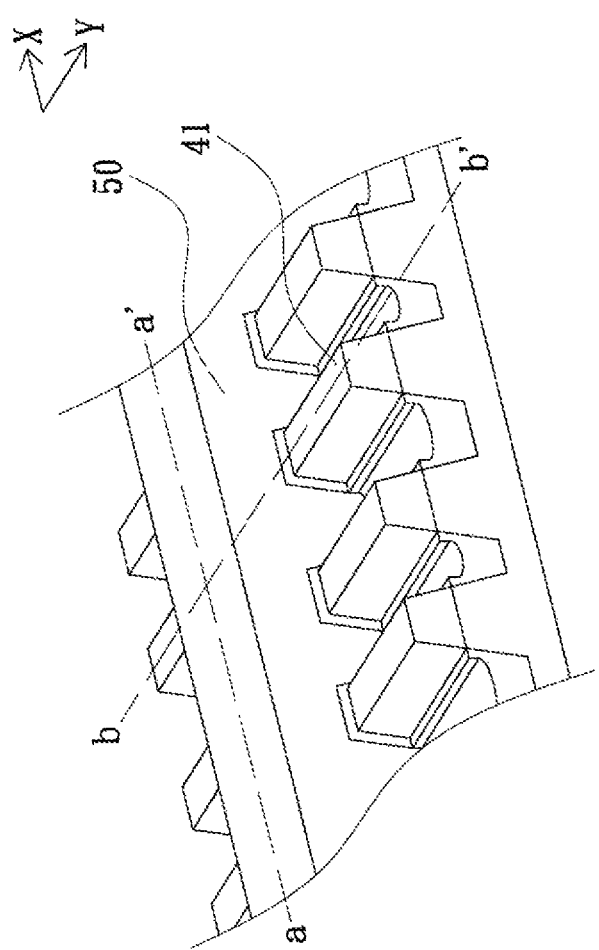
FIG. 10 is a schematic perspective view illustrating a FinFET device in accordance with an embodiment of the present invention.

Then, as shown in FIG. 9, a gate structure 50 is formed on parts of the epitaxial fin structure 41 and parts of the STI structure 20'. The formation of the gate structure 50 may include steps of: forming a gate dielectric layer 501 on parts of the epitaxial fin structure 41 and parts of the STI structure 20' and extending the gate dielectric layer 501 in a direction X which is perpendicular to an extending direction Y of the fin structure 200, as illustrated in FIG. 10; then, forming a gate material layer 502 on the gate dielectric layer 501 and parts of the STI structure 20' and extending the gate structure 50 in the direction X. Thus, the gate structure 50 including the gate dielectric layer 501 and the gate material layer 502 is formed. According to the aforementioned process, a fin field effect transistor device is formed as illustrated in FIG. 10. It is to be noted that FIG. 9 is a cross sectional view of the fin field effect transistor devices along line a-a' in the direction X in FIG. 10. In one embodiment, the gate dielectric layer 501 may include high-permittivity (high-k) materials and the gate material layer 502 may include conductor or semiconductor materials. Selectively, before the gate dielectric layer 501 is formed, a capping layer (not shown) may be formed on parts of the epitaxial fin structure layer 41 and parts of the STI structure 20'. In addition, after the gate dielectric layer 501 is formed but before the gate material layer 502 is formed, a metal work function layer (not shown) is selectively formed in response to an actual requirement.

Figure 11:
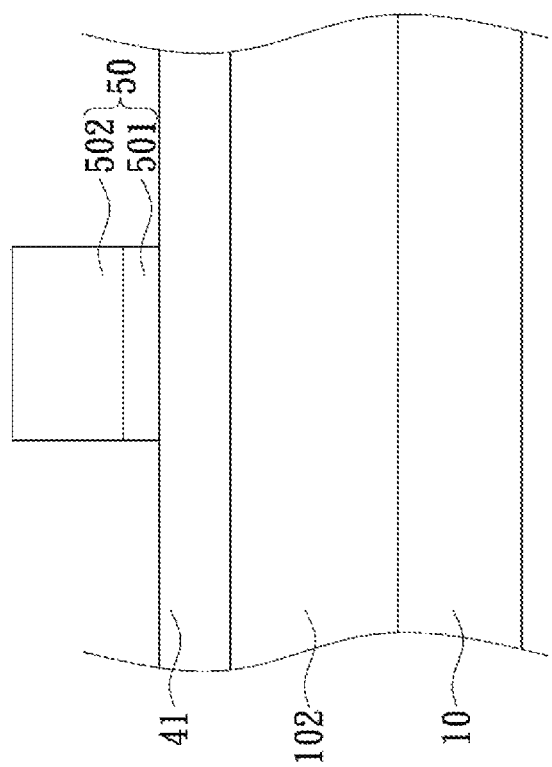
FIGS. 11-13 are cross sectional views illustrating parts of a method of fabricating a FinFET device in accordance with an embodiment of the present invention.
Figure 12:
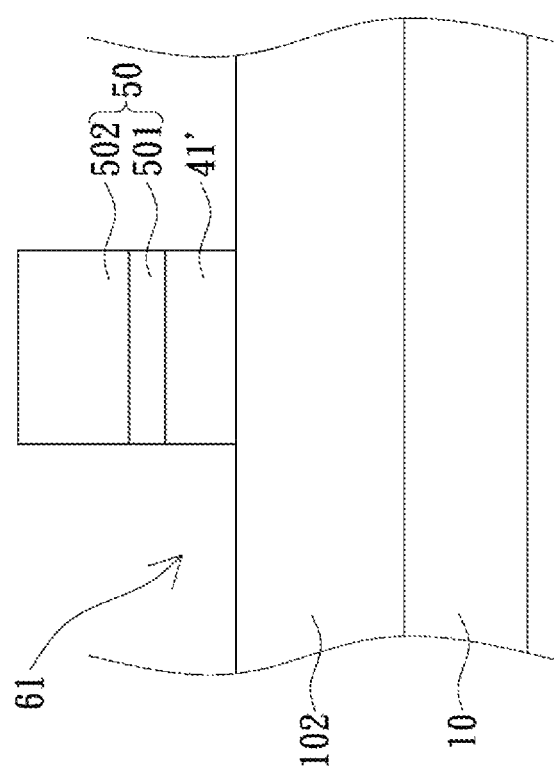
Figure 13:
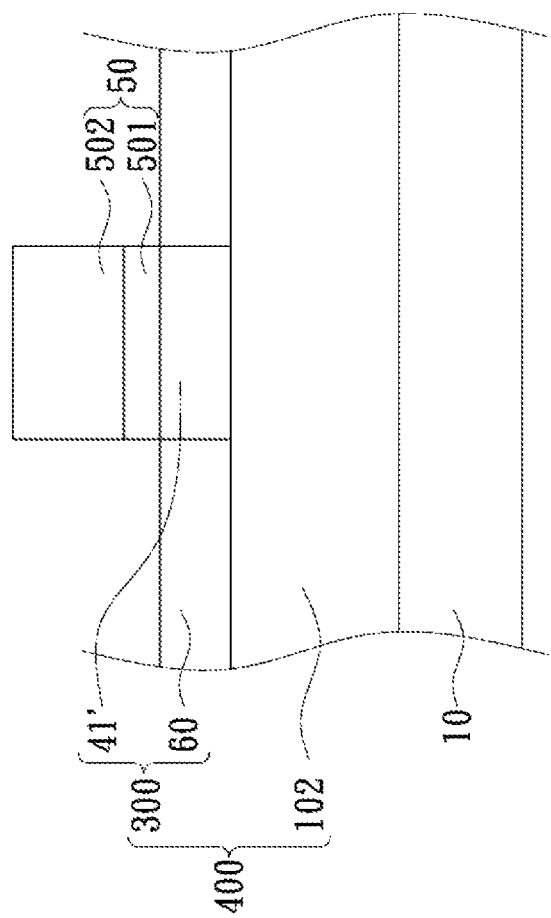
Figure 14:
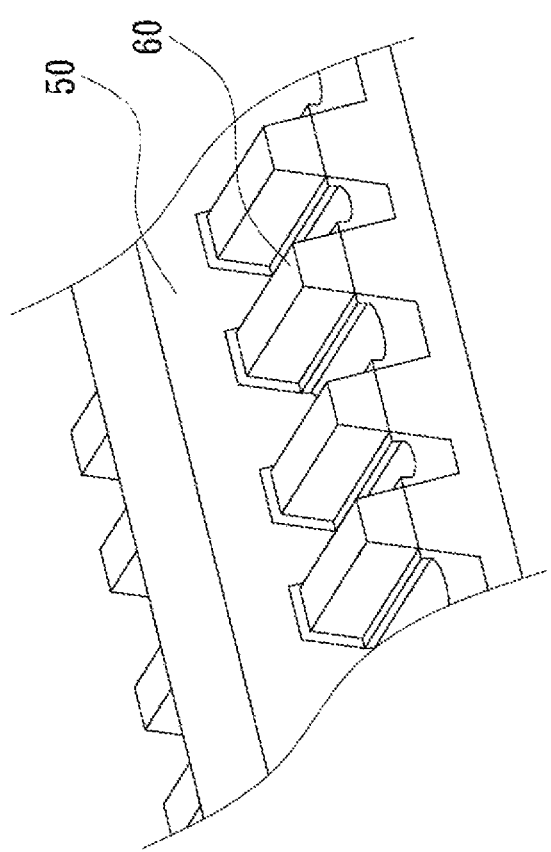
FIG. 14 is a schematic perspective view illustrating a FinFET device in accordance with an embodiment of the present invention.

After the formation of the gate structure 50, a process for forming a source/drain structure is then performed as shown in FIG. 11, which is a cross sectional view along line b-b' in the direction Y in FIG. 10. An etching process is performed on the two ends of the epitaxial fin structure 41; in other words, the parts of the epitaxial fin structure 41 covered under the gate structure 50 are left behind and other parts, where a source/drain structure 60 is going to form, of the epitaxial fin structure 41 are removed, thereby forming a removed area 61 and a fin-shaped channel structure 41', as shown in FIG. 12. After parts of the epitaxial fin structure 41 not covered under the gate structure 50 are partially removed, as shown in FIG. 13, the source/drain structure 60 is formed in the removed area 61; thus, the fabrication of the fin field effect transistor device as shown in FIGS. 13 and 14 is completed, wherein FIG. 14 is a stereoscope schematic view of the fin field effect transistor device in FIG. 13. Besides, the source/drain structure 60 and the fin-shaped channel structure 41' are together to form an epitaxial fin structure 300, and the epitaxial fin structure 300 and the base fin structure 102 are together to form a fin structure 400. It is noted that the composition of the source/drain structure 60 is different from that of the fin-shaped channel structure 41' and the substrate 10. In one embodiment, the source/drain structure 60 can include germanium (Ge); however, the percentage of Ge in the source/drain structure 60 is different from that in the fin-shaped channel structure 41'.

In accordance with the aforementioned embodiments, the present invention provides a fin field effect transistor device and a fabrication method thereof. By using the spacers to define and form the channel areas of a fin field effect transistor device, the fin field effect transistor device disclosed in the present invention not only has improved performance and quality but also has lower fabrication cost and time.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of fabricating a fin field effect transistor device, comprising:
   providing a substrate having a fin structure on a surface of the substrate;
   forming at least a shallow trench isolation structure on the surface of the substrate;
   forming a base fin structure with the shallow trench isolation structure concurrently, wherein the shallow trench isolation structure comprises a peripheral zone and a concave zone, and the peripheral zone physically contacts with the fin structure;
   forming a pair of spacers on a portion of a surface of the shallow trench isolation structure on two sides of a portion of the fin structure, respectively;
   forming an epitaxial fin structure on a top surface of the base fin structure;
   forming a gate structure on the epitaxial fin structure, wherein an extending direction of the gate structure is perpendicular to an extending direction of the epitaxial fin structure;
   partially removing a portion of the epitaxial fin structure not covered by the gate structure to form a removed area; and
   epitaxially growing a source/drain structure in the removed area, wherein a composition of the source/drain structure is different from that of the epitaxial fin structure.

2. The method of fabricating a fin field effect transistor device according to claim 1, wherein a top surface of the peripheral zone is higher than a top surface of the concave zone.

3. The method of fabricating a fin field effect transistor device according to claim 2, wherein a top surface of the base fin structure is coplanar with the top surface of the peripheral zone.

4. The method of fabricating a fin field effect transistor device according to claim 2, wherein a top surface of the base fin structure is higher than the top surface of the peripheral zone.

5. The method of fabricating a fin field effect transistor device according to claim 2, wherein a top surface of the base fin structure is lower than the top surface of the peripheral zone.

6. The method of fabricating a fin field effect transistor device according to claim 1, wherein a top surface of the epitaxial fin structure is aligned to a top of the pair of spacers.

7. The method of fabricating a fin field effect transistor device according to claim 1, wherein a top surface of the epitaxial fin structure is higher than a top of the pair of spacers.

8. The method of fabricating a fin field effect transistor device according to claim 1, wherein a top surface of the epitaxial fin structure is lower than a top of the pair of spacers.

9. The method of fabricating a fin field effect transistor device according to claim 1, wherein the epitaxial fin structure physically contacts with a top surface of the base fin structure and comprises germanium (Ge).

10. The method of fabricating a fin field effect transistor device according to claim 9, wherein a percentage of the germanium (Ge) in the epitaxial fin structure is from 50% to 100%.

11. The method of fabricating a fin field effect transistor device according to claim 1, wherein a bottom surface of the epitaxial fin structure is coplanar with a top surface of the peripheral zone.

12. The method of fabricating a fin field effect transistor device according to claim 1, wherein a bottom surface of the epitaxial fin structure is higher than a top surface of the peripheral zone.

* * * * *